(12) United States Patent
Saxby et al.

(10) Patent No.: US 6,326,547 B1
(45) Date of Patent: Dec. 4, 2001

(54) CABLE MANAGEMENT SYSTEM

(75) Inventors: Don M. Saxby, San Jose; Mark J. Williams, Menlo Park, both of CA (US); Thomas T. Hardt, Missouri City; Joseph R. Allen, Tomball, both of TX (US); Edward J. Kliewer, Sunnyvale, CA (US); Christopher Hunt, San Jose, CA (US); Henry C. Coles, III, Saratoga, CA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/432,145

(22) Filed: Nov. 2, 1999

(51) Int. Cl.[7] .................................................. H01B 7/06
(52) U.S. Cl. ..................... 174/69; 174/DIG. 9; 242/615; 312/273
(58) Field of Search ................................ 174/48, 49, 69, 174/72 A, 72 C, 72 R, 97, 135, DIG. 9; 312/273; 242/615

(56) References Cited

U.S. PATENT DOCUMENTS

| | | | | |
|---|---|---|---|---|
| 2,865,979 | * | 12/1958 | Klassen ................................. | 174/69 |
| 2,902,535 | * | 9/1959 | Francis ................................. | 174/69 |
| 3,120,411 | * | 2/1964 | Strumpell ............................. | 174/69 |
| 3,219,750 | * | 11/1965 | Davies ................................. | 174/69 |
| 3,257,156 | * | 6/1966 | Sisk et al. ........................... | 312/273 |
| 3,295,905 | * | 1/1967 | Sisk et al. ........................... | 312/273 |
| 3,335,326 | * | 8/1967 | Bonin et al. ......................... | 317/99 |
| 3,399,909 | * | 9/1968 | Ambrose ............................... | 174/69 |
| 3,433,889 | * | 3/1969 | Vries, Jr. .............................. | 174/69 |
| 3,448,346 | * | 6/1969 | Webb ................................... | 317/122 |
| 3,476,870 | * | 11/1969 | Ross .................................... | 174/69 |
| 3,488,430 | * | 1/1970 | Holzhauser ........................... | 174/69 |
| 3,647,936 | * | 3/1972 | Dryg .................................... | 174/69 |
| 3,676,572 | * | 7/1972 | Davies ................................. | 174/69 |
| 3,710,199 | * | 1/1973 | Cignoni, Jr. ......................... | 317/122 |
| 3,755,716 | * | 8/1973 | Yoshii et al. ........................ | 317/99 |
| 3,792,189 | * | 2/1974 | Stengel et al. ...................... | 174/69 |
| 3,818,283 | * | 6/1974 | Ward ................................... | 174/DIG. 9 |
| 3,848,361 | * | 11/1974 | Foster et al. ........................ | 174/69 |
| 4,614,383 | * | 9/1986 | Polley et al. ........................ | 174/69 |
| 5,093,867 | * | 3/1992 | Witte ................................... | 385/135 |
| 5,746,389 | * | 5/1998 | Willmann ............................. | 174/69 |
| 5,877,936 | * | 3/1999 | Nishitani et al. ................... | 174/69 |

* cited by examiner

Primary Examiner—Dean A. Reichard
Assistant Examiner—Adolfo Nino
(74) Attorney, Agent, or Firm—Fenwick & West LLP

(57) ABSTRACT

A cable management system for organizing and controlling cables extending from an electronic device while providing substantially unimpeded device access, substantially unrestricted cable movement and substantially unrestricted air flow into and out of the device. The system attaches to a secure structure and is capable of boxing out from the structure to allow access to service a device positioned within the secure structure. The cable management system includes at least three cable arms of rigid material, a coupling member attached between each adjacent pair of the at least three cable arms, where the coupling member provides movement between each of the adjacent pairs of cable arms.

37 Claims, 11 Drawing Sheets

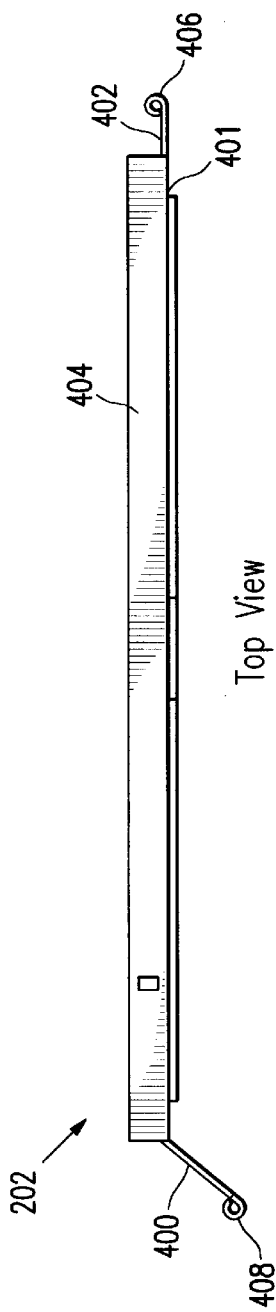
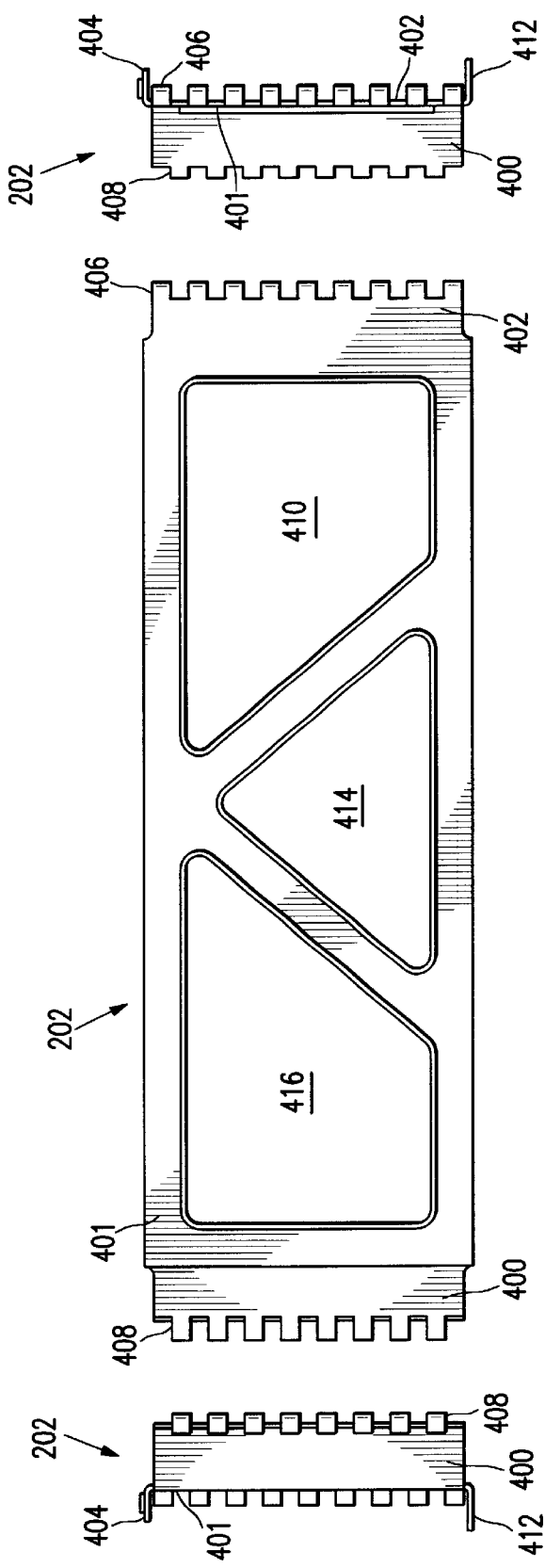
Top View
FIG. 4A
Front View
FIG. 4B
Side View
FIG. 4C
Side View
FIG. 4D

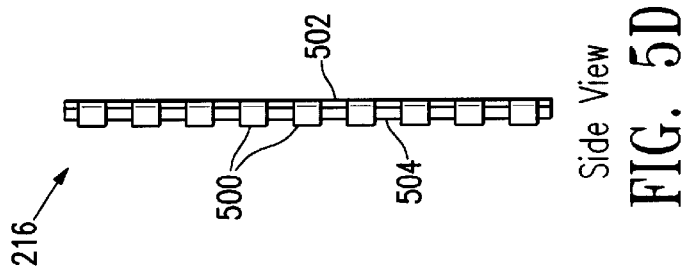
FIG. 5D Side View
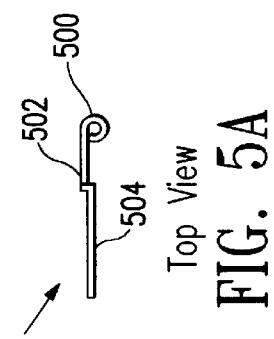
FIG. 5A Top View
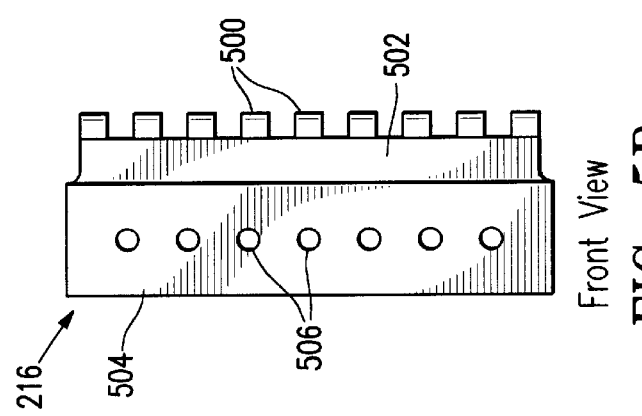
FIG. 5B Front View
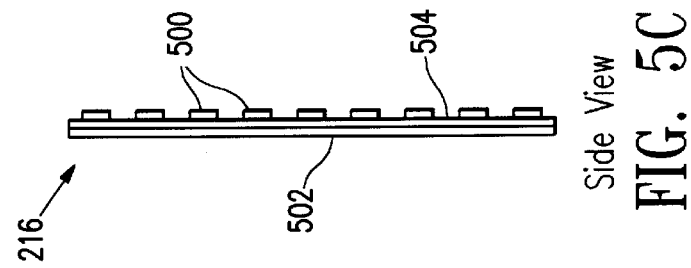
FIG. 5C Side View

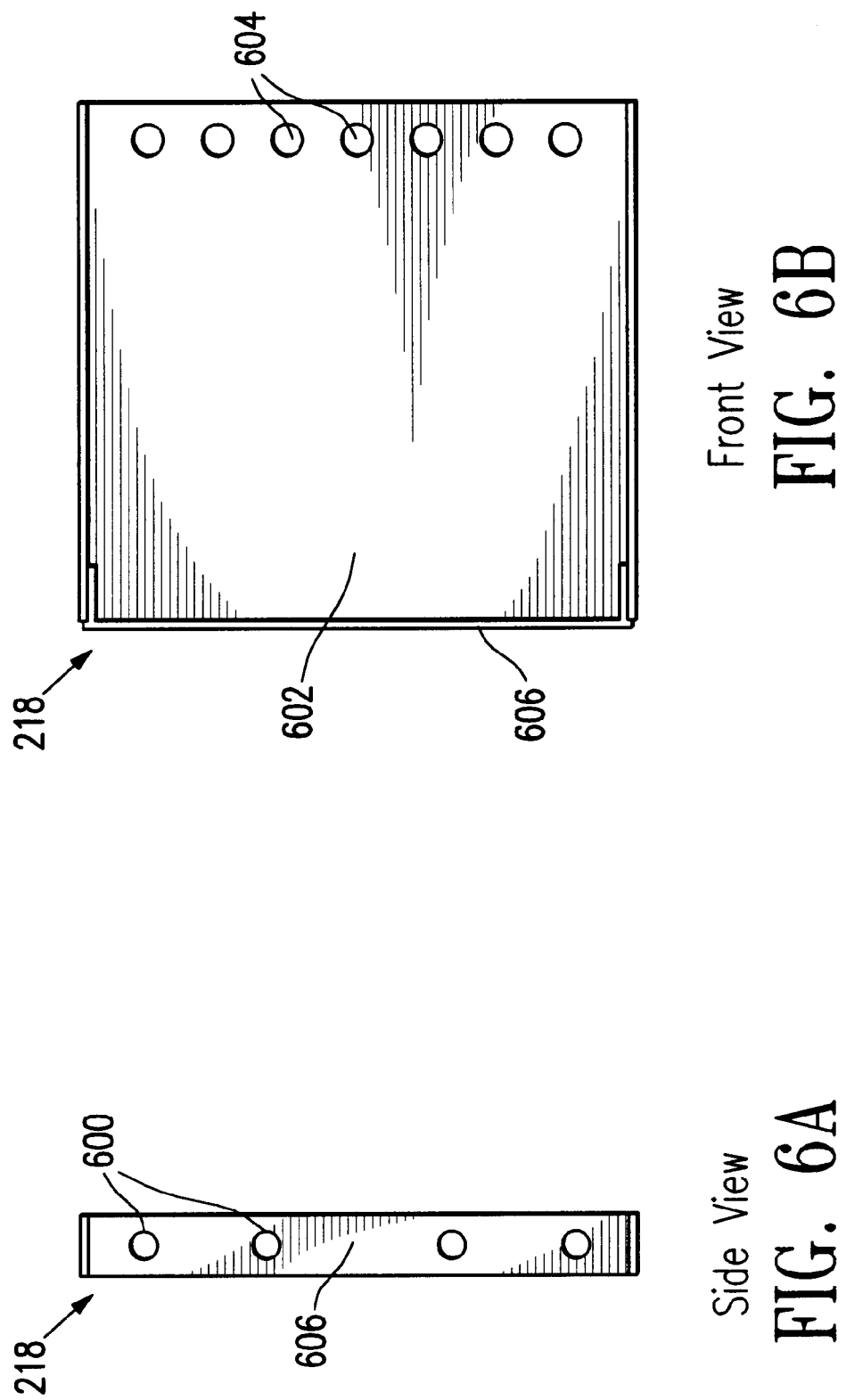

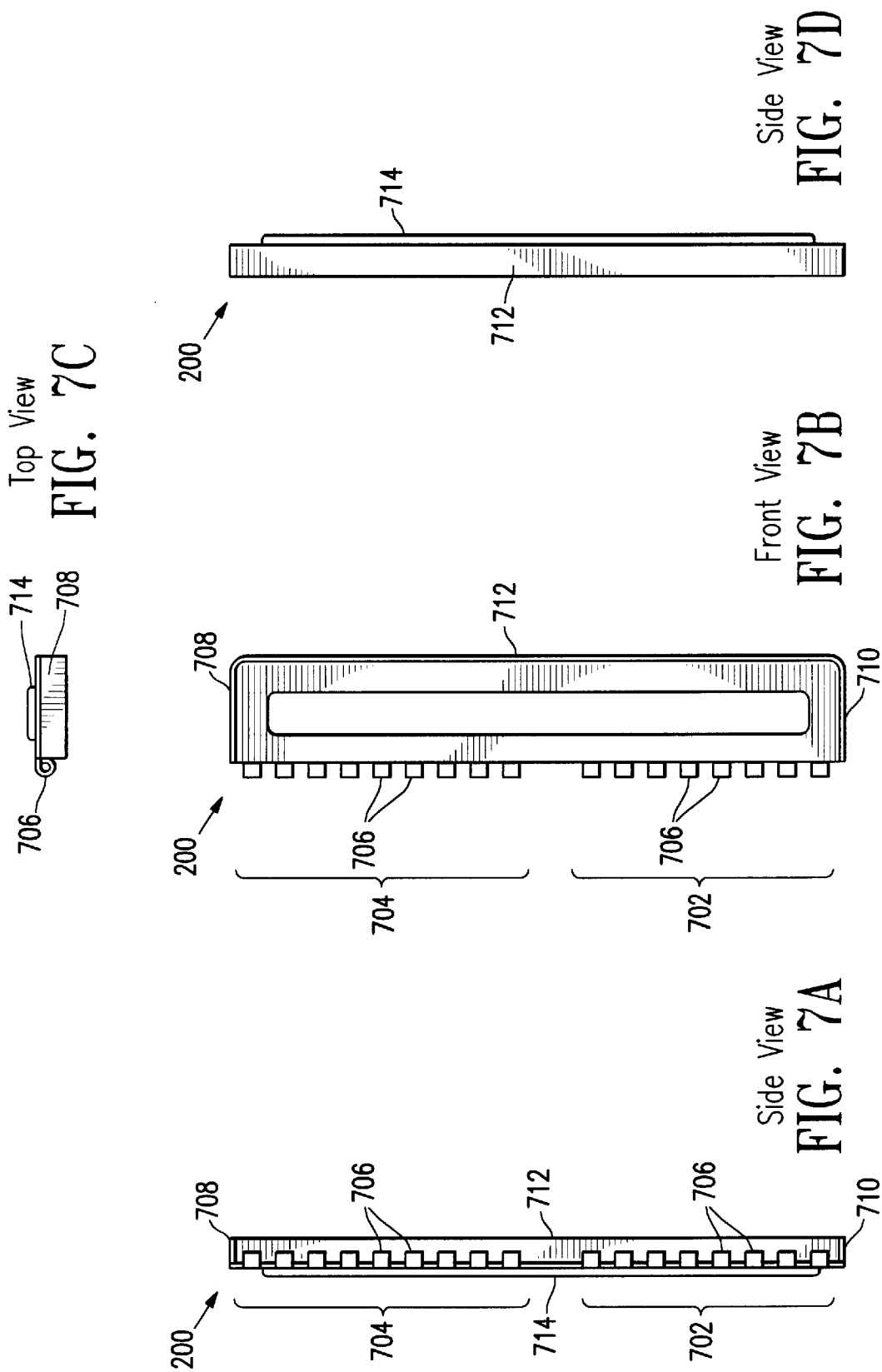

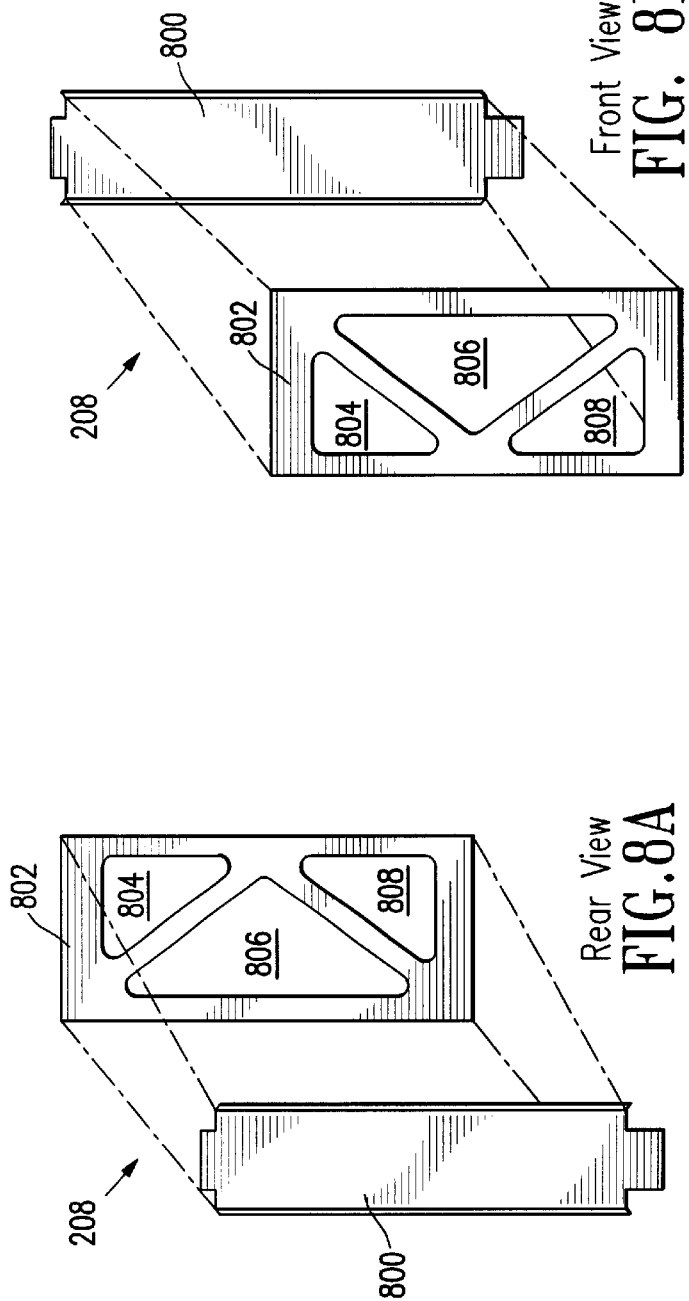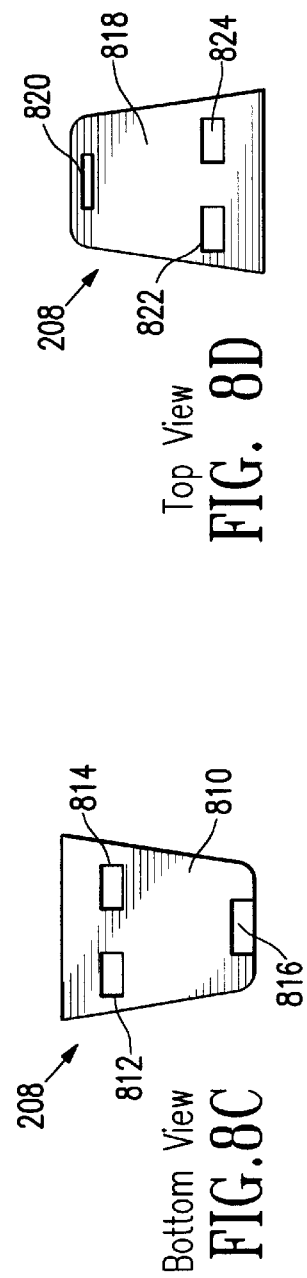

CABLE MANAGEMENT SYSTEM

TECHNICAL FIELD OF THE APPLICATION

This invention relates generally to cables and more specifically to a method and apparatus for managing cables extending from and connected to electronic devices.

BACKGROUND OF THE INVENTION

Electronic systems, such as computer and telecommunication systems, have become increasingly more complex and typically require numerous cable connections. A multitude of cables generally extend from each device. The cables of each device tend to become entangled and impede access to the device from which the cables extend from. As a result, it is typically difficult to service a computer or telecommunications system without the risk of mistakenly knocking out a cable, or accessing an incorrect cable.

Computer and telecommunication devices are typically maintained on rail-like cabinet systems. When a device requires service, a service technician typically accesses and opens the rear of the device's enclosure to access components within the device. However, since numerous cables typically extend from the rear of the device, this tends to be a difficult if not impossible task.

The difficulty of cable management has been exasperated by the computer industry's attempt to standardize the dimensions of the rail-like cabinet systems used for housing electronic devices. Since standardization of the cabinet systems tends to restrict increases in available rack space and depth of the cabinets, and because the dimensions of certain devices have increased, less space is available to manage the cables extending from each device. Furthermore, since the configuration of electronic devices housed on racks has increasingly become more dense, the space occupied by the devices tends to utilize the maximum amount of room provided by each rack. Due to the increased density of devices, a greater number of cables extend from each device in less available space, a condition conventional cable management systems are unable to accommodate.

Conventional cable management systems have unsuccessfully attempted to resolve this problem. For example, one type of conventional system typically includes fixed brackets that attempt to organize and control the cables extending from a device. However, since the brackets are fixed and therefore do not extend away from the device, the brackets ultimately provide a barrier that restricts access to the device. As a result, service personal are typically required to service the device by sliding the device forward. Once the device is moved forward, service personal must turn the device toward one side in an attempt to access the rear portion of the device.

Moving the device forward and turning the device toward one side pose a significant risk to the device's cable connections. For instance, fully extended cables may be pulled out. Cables tightly fastened to the device may jerk the device backward resulting in damage to the device. Thus, while conventional cable management systems may organize and control cables that extend from a device, these systems tend to restrict access to the device and may indirectly cause the device to be damaged during servicing. Furthermore, since there is a risk of over-extending the cables, it is typically necessary with conventional cable management systems to use extra long cables. Given that a typical server may include 39 or more cable connections, use of extra long cables becomes a costly necessity.

Conventional cable management systems tend to include two cable management arms. Since the maximum length of each arm is limited to the standard 17.5 inch width of a cabinet rack, the cable management provided by conventional systems is limited. Furthermore, the cables are typically held to the arms by clasps. A problem associated with conventional cable management systems is that this configuration tends to apply excessive force upon cable connectors and upon the components connected to the cables. These unwanted forces can cause signal loss along the cables and excessive and unsafe wear of the cables, cable connectors, and components. Furthermore, conventional cable management system clasps tend to prevent movement of the cables along the brackets. Hence, when a device is moved forward, conventional cable management system clasps prevent the cables from sliding across the rail brackets. As a result, the cables may either be pulled out from the device, or may cause the device to be jerked back, thereby damaging the device.

Conventional cable management systems also typically include brackets positioned in close relation to the device from which the cables extend from. The proximity of numerous cables clasped to brackets to the device tends to create a barrier that impedes the air flow entering and exiting the device. Impeding the device's air flow may cause the device to overheat and may ultimately damage the device.

As a result of the shortcomings of conventional cable management systems, there exists a need for a system and method for organizing and controlling cables extending from an electronic device that provides unimpeded device access, unrestricted cable movement and unimpeded air flow into and out of the effected device.

SUMMARY OF THE INVENTION

The present invention substantially improves on prior art systems and methods for managing cables that extend from a device. The cable management system of the present invention utilizes a multi-level, multi-arm bracketing system that includes at least three arms. The system provides unimpeded device access, unrestricted cable movement and unrestricted air flow into and out of the device. The system attaches to a secure structure and is capable of boxing out from the structure to allow access to service a device positioned within the secure structure. The cable management system comprises at least three cable arms of rigid material, a coupling member attached between each adjacent pair of cable arms of the at least three cable arms, where the coupling member provides movement between each of the adjacent pairs of cable arms of the at least three cable arms.

Typically, the devices are stored in a rail-like cabinet system that allows the device to be pulled out from a rack that is mounted to the rails. Because the cable management system of the present invention can be boxed out, it is possible to service the device from the rear so that it is not necessary to move the device. If however, it is necessary to pull the rack housing the device fully forward or backward, the system provides for comprehensive cable management as the device is moved into its new position. The comprehensive cable management provided by the present invention allows the use of higher cable counts and high cable mass cross sections. Hence, devices may be moved a greater distance for servicing, and therefore, may be manufactured into longer devices since a larger volume of each standardized rack may be used.

The present invention, in accordance with one embodiment, provides a system for managing at least one cable comprising: at least three cable arms of rigid material; a coupling member attached between each adjacent pair of cable arms of the at least three cable arms, wherein the coupling member provides movement between each of the adjacent pairs of cable arms of the at least three cable arms; and a cable slider slideably mounted upon at least one of the at least three cable arms, wherein the cable slider is capable of holding the at least one cable in a position such that the at least one cable can shift across the cable slider.

The present invention, in accordance with another embodiment, provides a system for managing at least one cable comprising: at least three cable arms; and a coupling member attached between each adjacent pair of cable arms of the at least three cable arms, wherein the coupling member provides movement between each of the adjacent pairs of cable arms of the at least three cable arms and allows the at least three cable arms to box out in spaced relation from a structure.

The invention may be better appreciated from the following Figures, taken together with the accompanying Detailed Description of the Invention.

BRIEF DESCRIPTION OF THE DRAWINGS

The invention will now be described with reference to the accompanying drawings, wherein:

FIG. 4A is a top view of a cable management arm of the cable management system of the present invention.

FIG. 4B is a front view of a cable management arm of the cable management system of the present invention.

FIG. 4C is a first side view of a cable management arm of the cable management system of the present invention.

FIG. 4D is a second side view of a cable management arm of the cable management system of the present invention.

FIG. 5A is a top view of a mounting hinge of the cable management system of the present invention.

FIG. 5B is a first side view of a mounting hinge of the cable management system of the present invention.

FIG. 5C is a front view of a mounting hinge of the cable management system of the present invention.

FIG. 5D is a second side view of a mounting hinge of the cable management system of the present invention.

FIG. 6A is a side view of a mounting flange of the cable management system of the present invention.

FIG. 6B is a front view of a mounting flange of the cable management system of the present invention.

FIG. 7A is a first side view of a cable management hinge plate of the cable management system of the present invention.

FIG. 7B is a front view of a cable management hinge plate of the cable management system of the present invention.

FIG. 7C is a top view of a cable management hinge plate of the cable management system of the present invention.

FIG. 7D is a second side view of a cable management hinge plate of the cable management system of the present invention.

FIG. 8A is a rear view of a cable slider of the cable management system of the present invention.

FIG. 8B is a front view of a cable slider of the cable management system of the present invention.

FIG. 8C is a bottom view of a cable slider of the cable management system of the present invention.

FIG. 8D is a top view of a cable slider of the cable management system of the present invention.

DETAILED DESCRIPTION OF A PREFERRED EMBODIMENT

Figure 1:
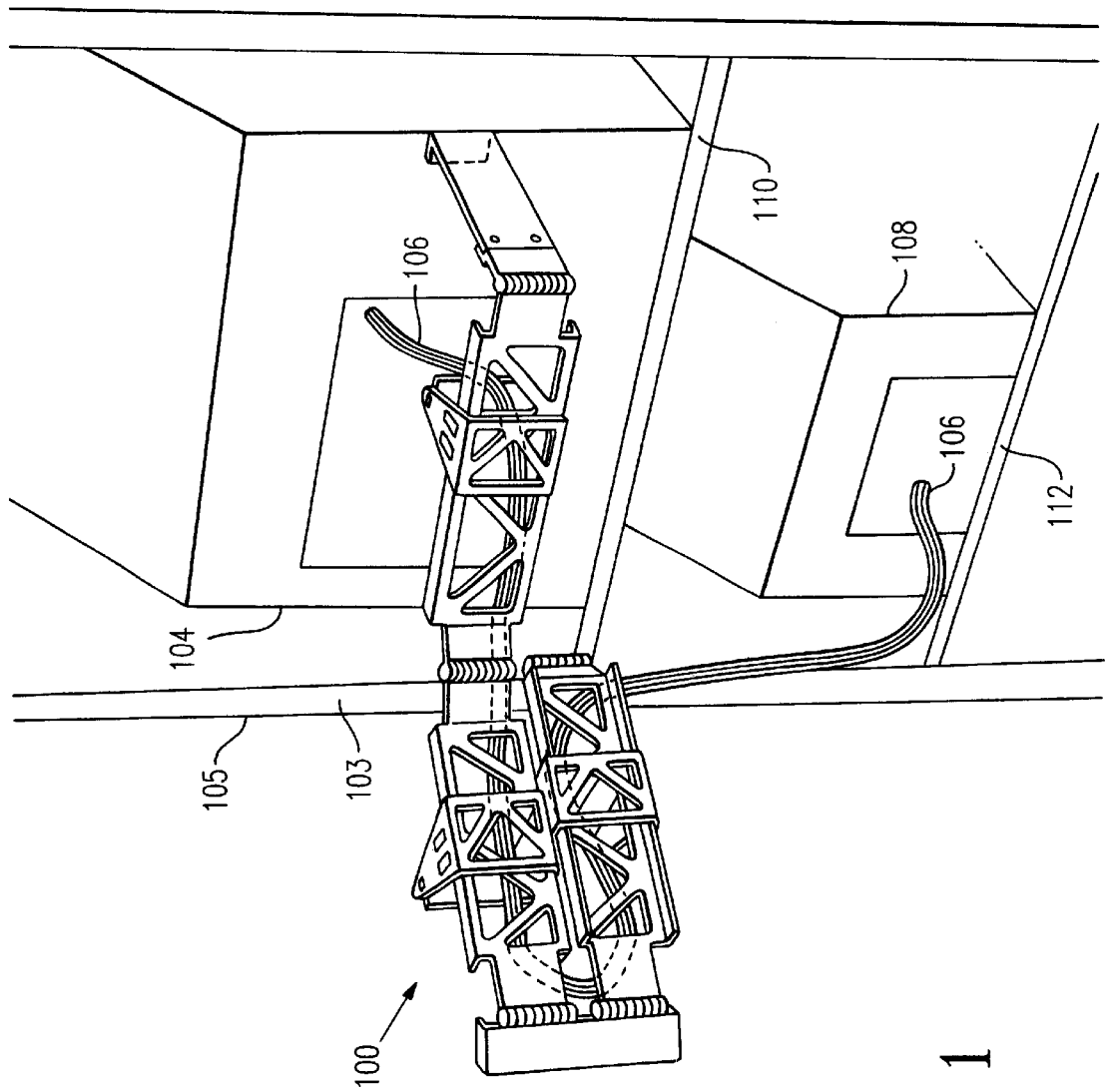
FIG. 1 is a perspective view of an embodiment of a cable management system of the present invention, where the cable management system is attached to shelves that hold electronic devices.

The following description is of the best presently contemplated mode of carrying out the invention. The description is made for the purpose of illustrating the general principles of the invention and is not to be taken in a limiting sense.

More particularly, one end of cable management system 100 is attached to rail 103 of an open styles cabinet 105 and the other end of cable management system 100 is attached to a rear portion of an electronic device 104. Cabinet 105 includes a series of shelves that are used for holding electronic devices. Example electronic devices may include but are not limited to computer servers, printers, modems, monitors, disk drives, zip drives, etc.

The shelves of cabinet 105 may each attach to a rolling mechanism (not shown) that allows the shelves to slide forward to assist individual's access of the respective electronic device. As shown, a top shelf, shelf 110 holds device 104, and a bottom shelf, shelf 112 holds device 108. Although only one device is shown on each shelf, one of ordinary skill in the art will recognize that numerous devices may be provided on each shelf.

As shown, cable management system 100 routes an exemplary cable 106 extending from a rear portion of device 108 to a rear portion of device 104. Cable 106 is wrapped across each component of cable management system 100. It will be appreciated that although one exemplary cable is shown, cable management system 100 may control numerous additional cables extending between device 108 and device 104. For example, cable management system 100 is capable of routing thirty Peripheral Component Interconnect (PCI) cables and seven legacy cables so that the cables do not interfere with access to devices adjacent to device 104. Also, cable management system 100 may control cables extending between device 104 and other devices (not shown).

One of ordinary skill in the art will recognize that cable management system 100 routes cables from a perspective of shelves 110 and 112 of cabinet 105. It will be appreciated that cable management system 100 eliminates forces on cable connectors or boards that the cable connectors are mounted on. These forces may typically cause signal loss and unsafe wear of cable connectors such as Small Computer System Interface (SCSI) ports.

Figure 2:
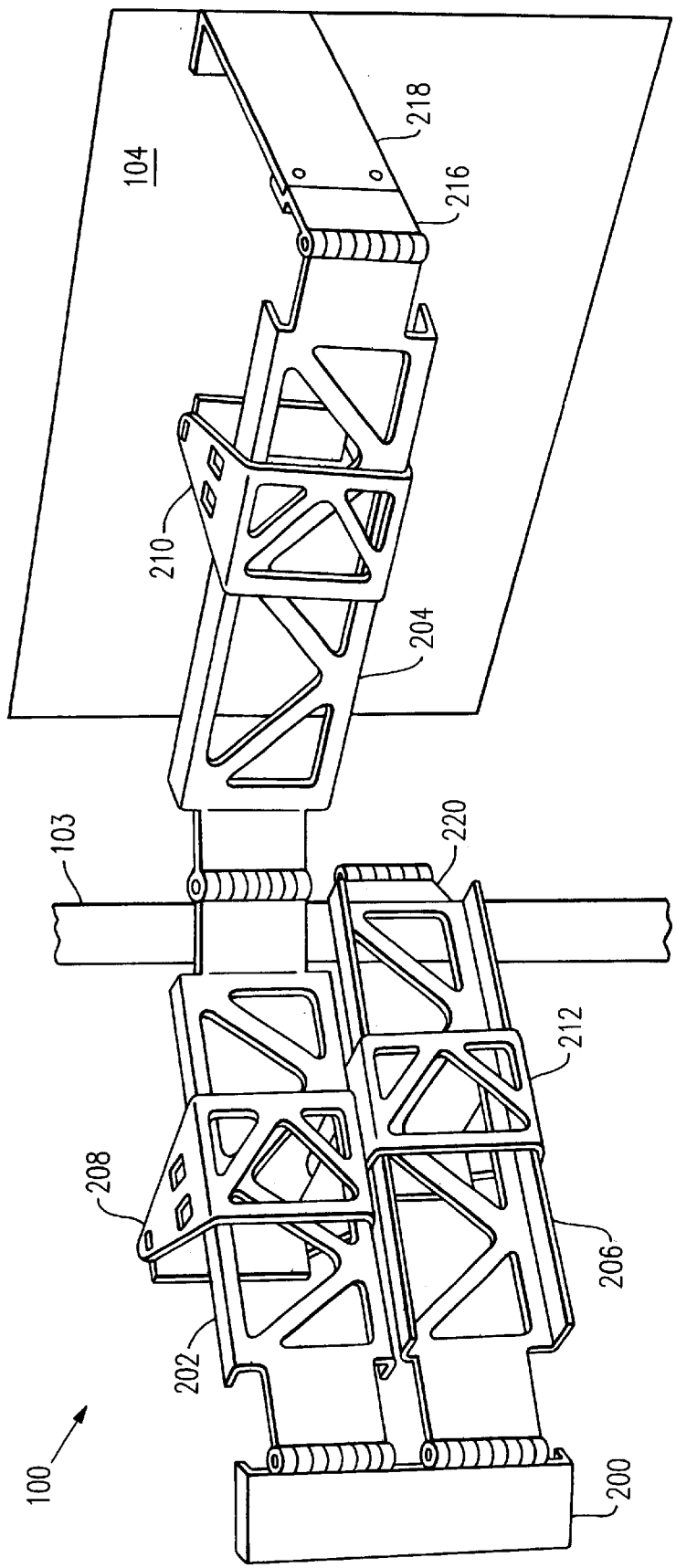
FIG. 2 is a perspective view of the cable management system of FIG. 1.

Referring now to FIG. 2, a perspective view of the cable management system 100 of FIG. 1 may be further appreciated. As shown, cable management system 100 includes cable arms 202, 204, and 206. Cable arms 202 and 204 are serially coupled, while cable arms 202 and 206 are coupled in parallel. Cable arms 202 and 204 are serially coupled at a hinge portion of each respective cable arm. A hinge portion of mounting arm 202 is coupled to a hinge portion of hinge plate 200, and a hinge portion of mounting arm 206 is coupled to a hinge portion of hinge plate 200. Due to the parallel coupling of mounting arms 202 and 206 to hinge plate 200, cable management system is composed of two levels. It will be appreciated that due to the flexibility of the design of cable management system 100, this system may include one or more levels of cable management arms.

A mounting hinge 220 affixes cable arm 206 of one end of cable management system 100 to a rail 103 of an open styled cabinet (not shown). It will be appreciated that certain types of rails or mounting areas may require that a mounting flange extend from mounting hinge 220 for the purpose of coupling cable management system 100 to the mounting area. A mounting flange 216 couples cable arm 204 to a mounting flange 218 that affixes the other end of cable management system 100 to a rear portion of device 104. One of ordinary skill in the art will understand that according to alternative embodiments of the present invention, cable management system 100 may be affixed to other types of fixed structures such as desks, wall posts, etc.

In order to organize and manage cables, a cable slider for routing the cable across cable management system 100 is slideably mounted to each cable arm. For example, a cable slider 208 is slideably mounted to cable arm 202, a cable slider 210 is slideably mounted to cable arm 204, and a cable slider 212 is slideably mounted to cable arm 206. A top flange and a bottom flange extending from each cable arm supports the movement of one or more cable sliders. It will be appreciated that since each cable slider is capable of sliding across its respective cable arm, cable management system 100 may be configured to route one or more different types and quantities of cables. It will also be appreciated that the open design of the cable sliders allows for easy access of the cables (See FIGS. 8A and 8B).

One of ordinary skill in the art will understand that the bi-level cable arms of cable management system 100 promote torsional bending. It will also be appreciated that the two levels of cable management system 100 promote movement that allows cable management system to be spaced in a boxed out fashion in relation to the structure to which it is attached to. For example, in FIG. 2, cable management system 100 is capable of being boxed out from rail 103 and device 104. One of ordinary skill in the art will recognize that the ability to box out cable management system 100 in spaced relation to device 104 facilitates access to service the device and the cables extending from that device.

It will also be appreciated that cable management system 100 is preferably composed of coined metal that provides substantial strength to reduce bending at the joints. Similarly, the hinge portions of cable management system 100 preferably include tall hinges with large knuckles, and large diameter pins to substantially reduce sagging at the hinges. Also, ventilation portions of the cable management system includes returned air holes instead of punch outs which increase the torsional rigidity of cable management system 100.

Figure 3:
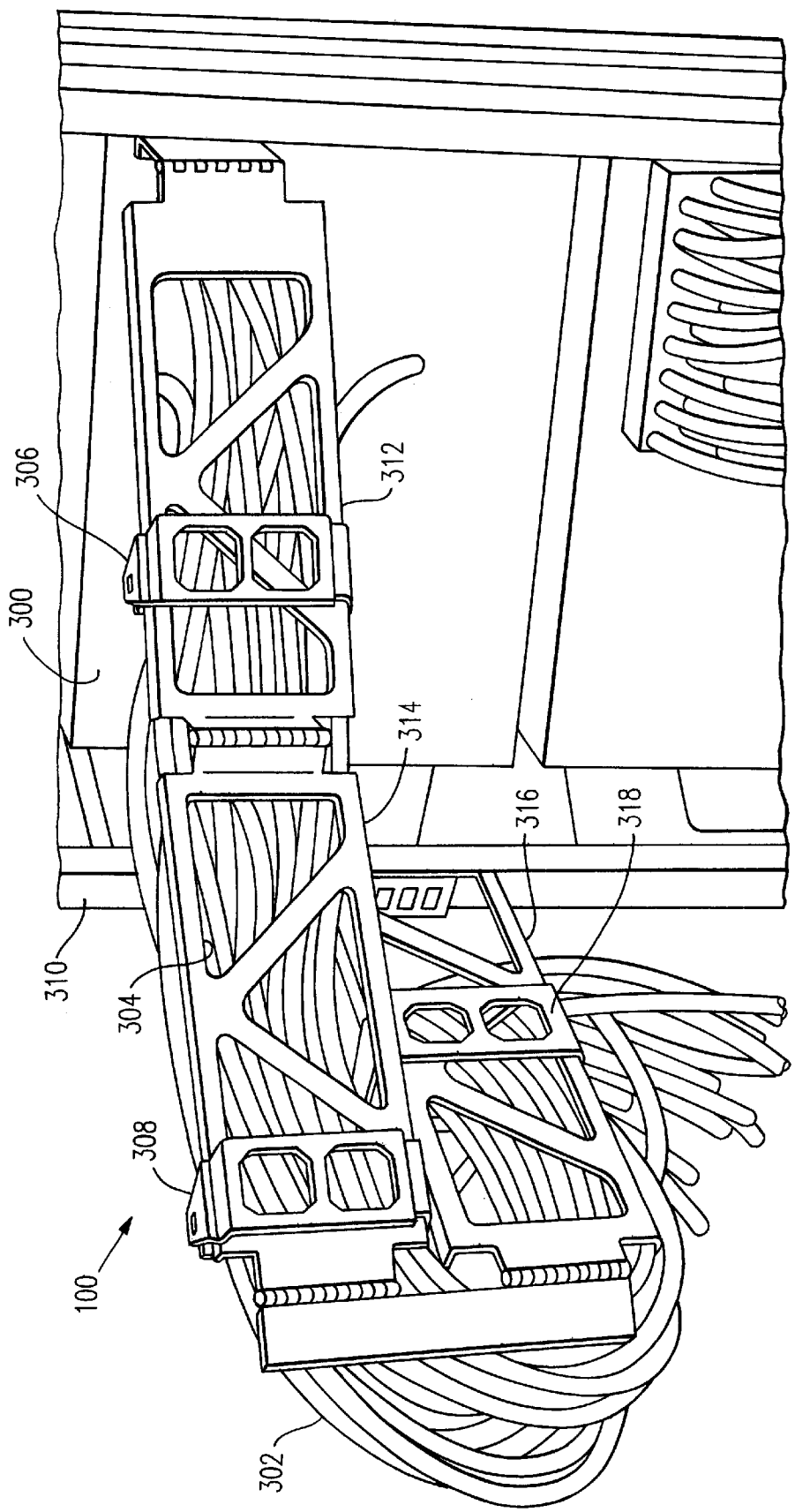
FIG. 3 is a perspective view of a cable management system of the present invention shown maintaining numerous cables extending from an electronic device.

Referring now to FIG. 3, a perspective view of cable management system 100 is shown maintaining a plurality of cables 302 extending from an electronic device 300. Cable management system 100 is affixed on one end to a rail 310 of an open styled cabinet and to a rear portion of an electronic device 300. The plurality of cables 302 extending from device 300 are held across cable arms 312, 314 and 316. It will be appreciated that cable arms 312, 314 and 316 each include ventilation portions, such as ventilation portion 304, for allowing air to freely flow into and out of device 300. One of ordinary skill in the art will understand the importance of having substantially unimpeded air flow into and out of electronic device 300. For example, substantially unimpeded air flow prevents electronic device 300 from over-heating and decreasing the device's effective life.

Cable sliders 306, 308 and 318 are moved into position respectively on cable arms 312, 314 and 316. One of ordinary skill in the art will appreciate that each cable slider is positioned to provide maximum support for cables that are held across cable management system 100. It will also be appreciated that each cable slider is capable of moving across its respective cable arm as the cables move during servicing of electronic device 300.

Cable management system 100 includes cable arms 312 and 314 coupled on one level of cable management system 100, and cable arm 316 coupled on a second level to cable arm 314. It will be appreciated that during servicing of device 300, the bi-level configuration of this cable management system 100 minimizes strain on cable connectors attached to device 300. Cable sliders 306, 308 and 318 also minimize strain on cable connectors by allowing the cables to move when device 300 is serviced.

It will be appreciated that when servicing device 300, the flexible configuration of cable management system 100 allows the system 100 to be boxed out. Boxing out the system 100 provides an individual access to service the device 300 regardless of the quantity of cables extending from the device 300. When boxing out cable management system 100, cables typically move across the cable arms. However, movement of the cables do not present a problem, since the cable sliders 306, 308 and 318 move with the cables. Accordingly, minimal stress and tension is placed upon either the cables or the cable connectors. One of ordinary skill in the art will understand the benefits, when servicing a device, of minimizing the risk of damaging either the cables, and cable connectors.

Referring now to FIGS. 4A, 4B, 4C and 4D, these figures depict several views of cable management arm 202 of FIG. 2. FIGS. 4A, 4B, 4C and 4D are respectively a top, front, a first side and a second side view of cable management arm 202 of cable management system 100 of the present invention. It will be appreciated that with regard to FIGS. 4A, 4B, 4C and 4D, cable management arm 202 is shown as a representative example of each of the three cable management arms 202, 204, and 206 of FIG. 2. As shown, cable management arm 202 includes a main body 401 having ventilation portions 410, 414 and 416. A flange 404 extends from the top portion of main body 401 and a flange 412 extends from the bottom portion of main body 401. A connective portion 400 extends from one side of main body 401 to a hinge portion 408, and a connective portion 402 extends from the other side of main body 401 to a hinge portion 406.

Referring now to FIGS. 5A, 5B, 5C, and 5D that respectively show a top, first side, front and second side view of a mounting hinge 216 of cable management system 100 of the present invention. It will be appreciated that with regard to FIGS. 5A, 5B, 5C and 5D, mounting hinge 216 is a representative example of mounting hinges 216 and 220 of cable management system 100. As shown, mounting hinge 216 includes a mounting portion 504 for coupling one end of mounting hinge 216 to a mounting flange 218 or other type of mounting area (e.g., rail), a hinge portion 500 for coupling mounting hinge 216 to cable management arm 204, and a connective portion 502 therebetween. Mounting portion 504 includes a series of circular apertures 506 for mounting cable management system with one or more attachment element to mounting flange 218. An attachment element such as a screw and a washer may be inserted within each circular aperture to secure mounting hinge 216 to mounting flange 218. One of ordinary still in the art will understand that a pin is inserted within hinge portion 500 to couple mounting hinge 216 to a mounting flange 218 and to cable management arm 204.

Referring now to FIGS. 6A and 6B that respectively show a side a front view of a mounting flange 218 of cable management system 100 of the present invention. It will be appreciated that mounting flange 218 is a representative example of other mounting flanges that may be included within cable mounting system 100. Mounting flange 218 includes a connective portion 602 that includes one or more circular apertures 604. Circular apertures 604 are provided to couple cable management system 100 to device 104. More specifically an attachment element is inserted into each circular aperture 600, 604 of mounting flange 218 to couple a mounting hinge, such as mounting hinge 216, to a rear portion of device 104. For example, an attachment element such as a screw may be inserted and a washer provided at each circular aperture 604 to secure mounting hinge 216 to mounting flange 218. A flange portion 606 is provided at the end of mounting flange 218 to affix cable management system 100 to a rear portion of device 104. One of ordinary skill in the art will understand that since circular apertures are provided to mount cable management system to a mounting area such as a rail or rear portion of a device instead of slots, the circular apertures substantially eliminate potential angular displacement or droop that occurs with conventional cable management systems.

Referring now to FIGS. 7A, 7B, 7C and 7D that respectively show a first side view, a front view, a top view and a second side view of a hinge plate 200 of cable management system 100 of the present invention. It will be appreciated that hinge plate 200 is a representative example of other hinge plates that may be included within cable mounting system 100. Hinge plate 200 includes a first hinge portion 702 and a second hinge portion 704 having a one or more knuckles 706, a top flange portion 708, a bottom flange portion 710, a side flange portion 712 and an extended portion 714.

As shown in FIGS. 1 and 2, each hinge portion 702 and 704 of hinge plate 200 inter-links with a hinge portion of a cable management arm. For example, as shown in FIG. 2, hinge portion 702 of hinge plate 200 couples with the hinge portion of cable management arm 206, and hinge portion 704 of hinge plate 200 couples with the hinge portion of cable management arm 202. One of ordinary skill in the art will understand that a pin is insertable within the knuckles of the hinge portions for the purposes of coupling hinge plate 200 to exemplary cable management arms 206 and 202. One or ordinary skill in the art will also understand that depending upon the number of cable management arms, cable management system 100 may include one or more hinge plates 200.

Referring now to FIGS. 8A, 8B, 8C and 8D that respectively show a rear view, a front view, a bottom view and a top view of a cable slider 208 of cable management system 100 of the present invention. It will be appreciated that cable slider 208 is a representative example of other cable sliders that may be included within cable mounting system 100. Cable slider 208 includes a rear portion 800 connected in spaced relation to a front portion slider frame 802, a top portion 818 and a bottom portion 810. Front portion slider frame 802 includes ventilation portions 804, 806 and 808. It will be appreciated that the ventilation portions promote substantially unimpeded view and access of the cables routed across cable management system 100. The ventilation portions also do not impede air flow into and out of electronic device 104. Bottom portion 810 includes ventilation portions 812 and 814, and an aperture 816 to receive and couple with rear portion 800. Top portion 818 includes ventilation portions 822 and 824, and an aperture 820 to receive and couple with rear portion 800. One of ordinary skill in the art will understand coupling of the top, bottom and rear portion of the cable slider 208.

Cable slider 208 is supported by the top and rear flange of a cable management arm. Accordingly, cable slider 208 is not fixed along a cable management arm and can be moved into an appropriate position to effectively support the type and quantity of cables being routed. Also, the spaced distance between front portion 802 and rear portion 800 facilitates the movement of the cables, so that the cables do not unexpectedly catch, thereby causing potential damage to both cables and cable connectors.

Figure 9:
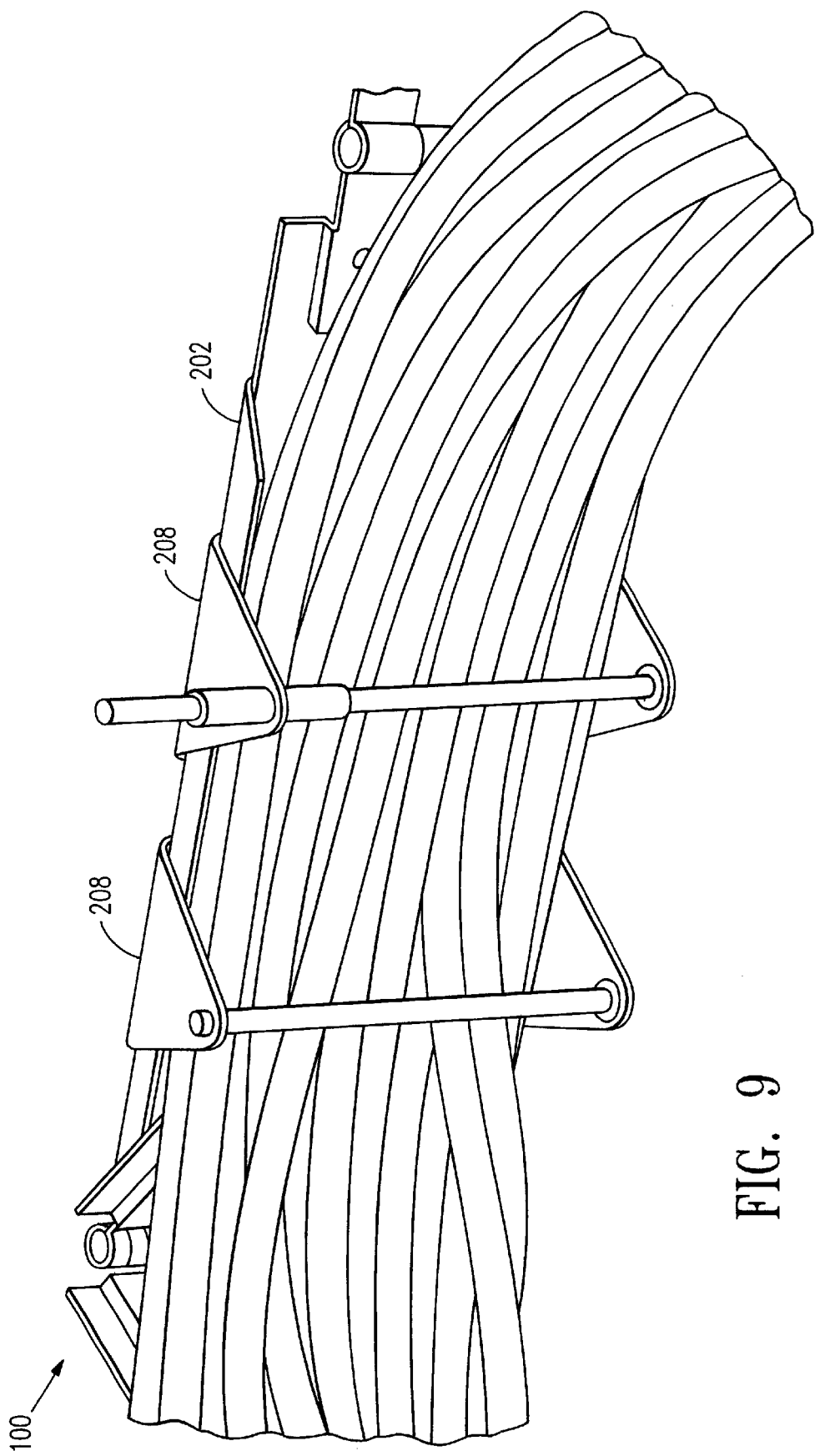
FIG. 9 is a perspective view of a cable management system of the present invention shown maintaining numerous cables extending from an electronic device.

Now referring to FIG. 9, a perspective view of an alternate embodiment of cable management system 100 of the present invention is shown routing numerous cables extending from an electronic device. Each of cable management sliders 208 are capable of moving across cable management arm 202 to accommodate the movement of the cables. For example, cables will likely move when electronic device 104 is serviced and there is a need to access the rear portion of device 104. Movement of the cable may occur when cable management system is boxed out to allow for access to device 104. As shown, cable management sliders 208 allow the cables to move without restriction across cable management system 100.

Figure 10:
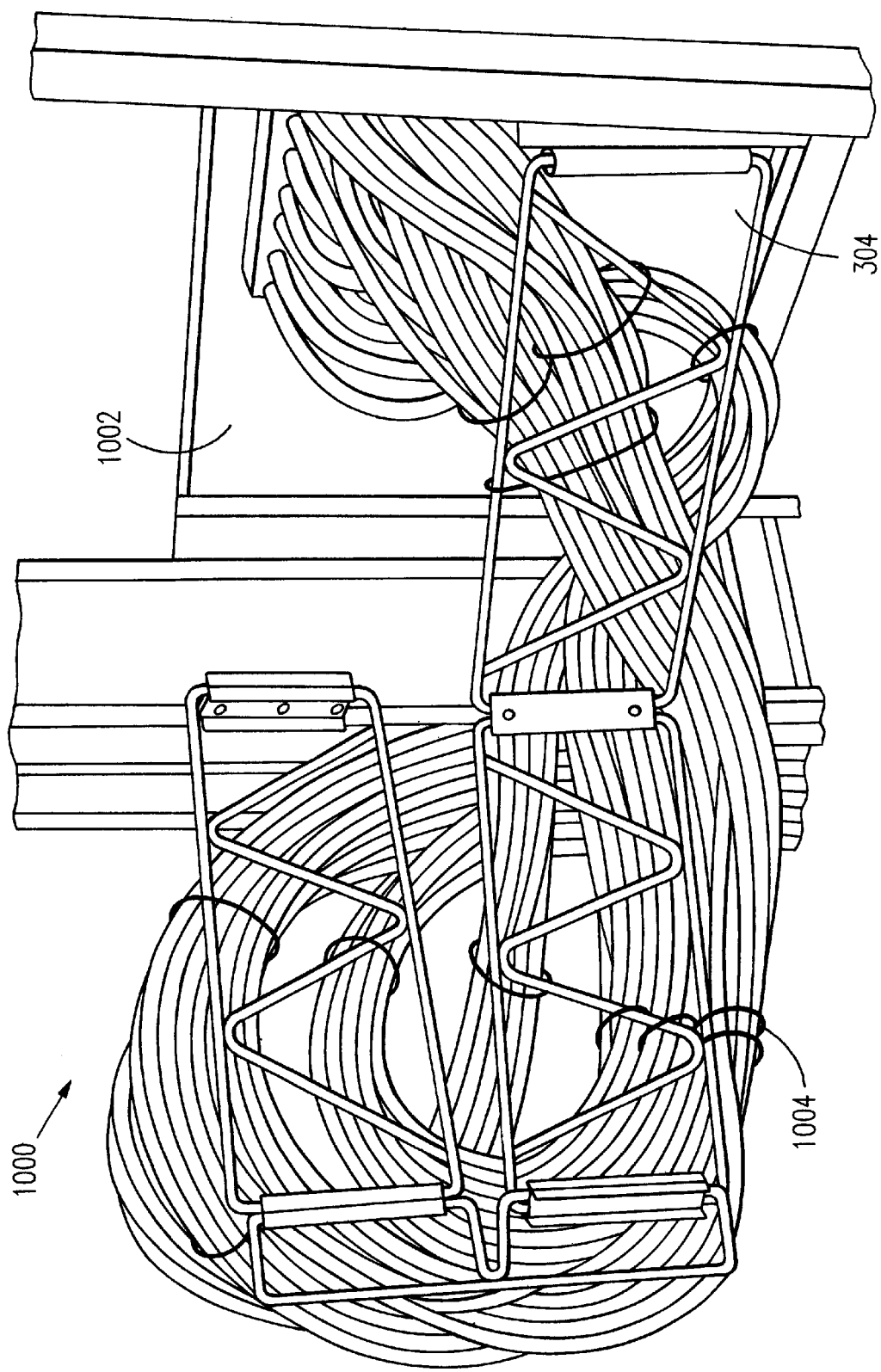
FIG. 10 is a perspective view of a wire form embodiment of the cable management system of the present invention.

FIG. 10 is a perspective view of a wire form embodiment of a cable management system 1000 of the present invention. As shown, the wire form embodiment of the cable management system promotes substantial air flow into and out of electronic device 1002. According to this embodiment, straps (e.g., Velcro strips) 1004 are provided to route cables across cable management system 1000. One of ordinary skill in the art will recognize that this wire form embodiment, like the embodiment previously described above, includes three cable management arms configured in a bi-level system.

Figure 11:
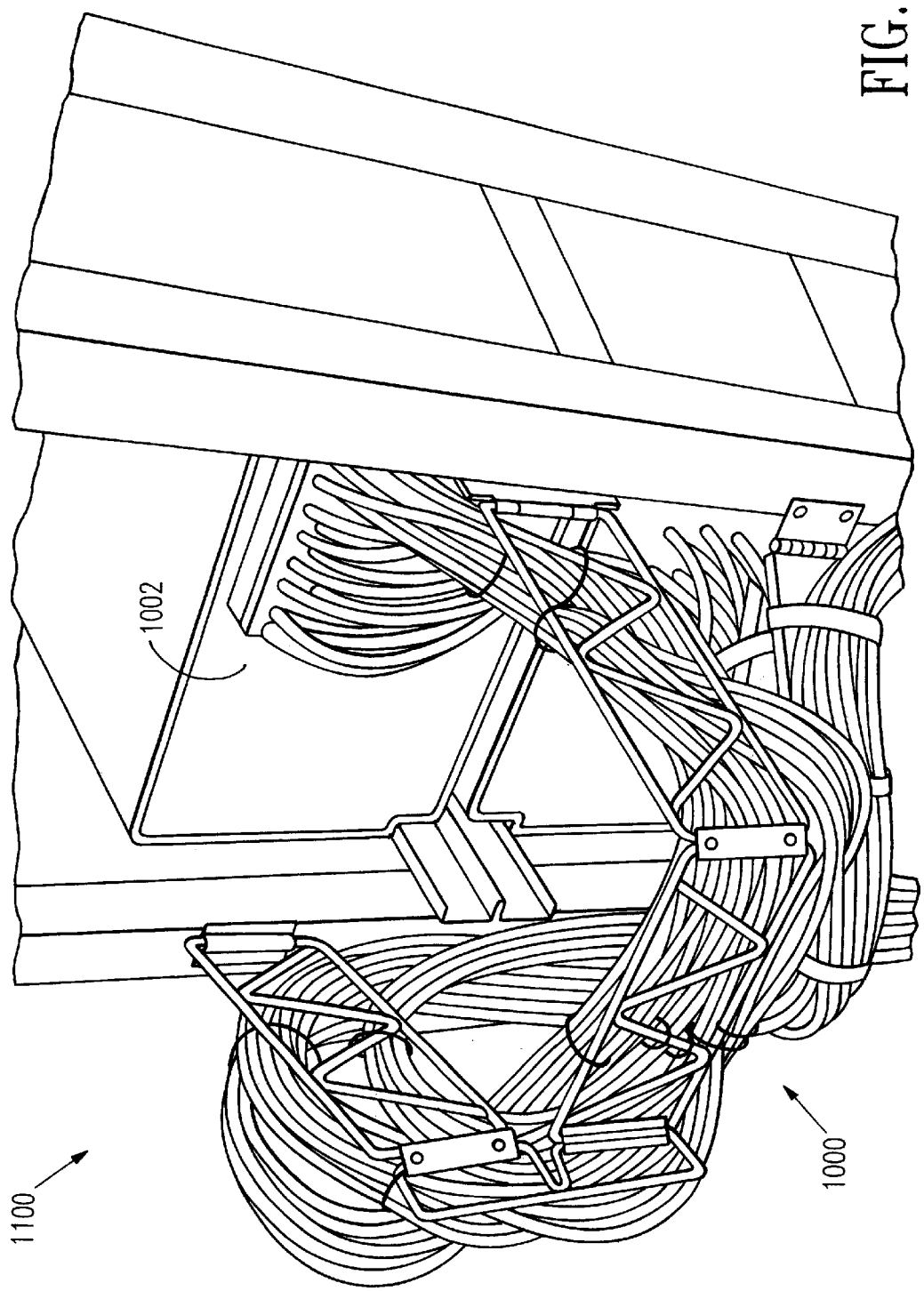
FIG. 11 shows an elevated view of the wire form embodiment of the cable management system of FIG. 10.

FIG. 11 shows an elevated view 1100 of the wire form embodiment of the cable management system 1000 of FIG. 10. As shown, cable management system 1000 is boxed out in spaced relation to the rear portion of electronic device 1002. It will be appreciated that the space provided between device 1002 and cable management system 1000 allows for substantially unimpeded access to service device 1002.

It can therefore be appreciated that a new and novel cable management system has been described. It will be appreciated by those skilled in the art that, given the teaching herein, numerous alternatives and equivalents will be seen to exist which incorporate the invention disclosed hereby. As a result, the invention is not to be limited by the foregoing exemplary embodiments, but only by the following claims.

We claim:

1. A system for managing at least one cable comprising:
   at least three cable arms of rigid material;
   a coupling member attached between each adjacent pair of cable arms of the at least three cable arms, wherein the coupling member provides movement between each of the adjacent pairs of cable arms of the at least three cable arms; and a cable slider slideably mounted upon at least one of the at least three cable arms, wherein the cable slider is capable of holding the at least one cable in a position such that the at least one cable can shift across the cable slider.

2. The system of claim 1, further including a mounting hinge, wherein one end of the mounting hinge attaches to an end portion of the coupled at least three cable arms and the other end of the mounting hinge attaches to one from a group comprising a structure, an electronic device, and a mounting flange.

3. The system of claim 2, wherein the structure is a cabinet having rails, wherein the other end of the mounting hinge is attached to one of the rails.

4. The system of claim 1, further including a mounting flange, wherein one end of the mounting flange attaches to one from a comprising a mounting hinge and an end portion of the coupled at least three cable arms, and the other end of the mounting flange attaches to one of a group comprising a structure and an electronic device.

5. The system of claim 3, wherein the structure is a cabinet having rails, wherein the other end of the mounting flange is attached to one of the rails.

6. The system of claim 1, wherein one of the at least three cable arms includes at least one ventilation portion that promotes air flow.

7. The system of claim 6, wherein the ventilation portion is triangular shaped.

8. The system of claim 1, wherein the cable slider includes at least one ventilation portion that promotes air flow.

9. The system of claim 8, wherein the ventilation portions are triangular shaped.

10. The system of claim 1, wherein the coupling member comprises a hinge coupled to a rigid plate.

11. The system of claim 1, wherein the coupling member serially couples a first adjacent pair of cable arms of the at least three cable arms.

12. The system of claim 1, wherein the coupling member couples in parallel a second adjacent pair of cable arms of the at least three cable arms.

13. The system of claim 1, wherein one of the cable arms of the at least three cable arms includes a flange for supporting the cable slider.

14. The system of claim 1, wherein one adjacent pair of cable arms of the at least three cable arms are serially coupled and another adjacent pair of cable arms of the at least three cable arms are coupled in parallel, so that the system is a multi-level system.

15. A system for managing at least one cable comprising:
at least three cable arms; and
a coupling member attached between each adjacent pair of cable arms of the at least three cable arms, wherein the coupling member provides movement between each of the adjacent pairs of cable arms of the least three cable arms and allows the at least three cable arms to box out in spaced relation from a structure.

16. The system of claim 15, wherein one adjacent pair of cable arms of the at least three cable arms are serially coupled and another adjacent pair of cable arms of the at least three cable arms are coupled in parallel, so that the system is a multi-level system.

17. The system of claim 16, further including a mounting hinge, wherein one end of the mounting hinge attaches to an end portion of the coupled at least three cable arms and the other end of the mounting hinge attaches to one from a group comprising a structure, an electronic device, and a mounting flange.

18. The system of claim 17, wherein the structure is a cabinet having rails, wherein the other end of the mounting hinge is attached to one of the rails.

19. The system of claim 16, further including a mounting flange, wherein one end of the mounting flange attaches to one from a comprising a mounting hinge and an end portion of the coupled at least three cable arms, and the other end of the mounting flange attaches to one of a group comprising a structure and an electronic device.

20. The system of claim 18, wherein the structure is a cabinet having rails, wherein the other end of the mounting flange is attached to one of the rails.

21. The system of claim 16, wherein one of the at least three cable arms includes at least one ventilation portion that promotes air flow.

22. The system of claim 16, further comprising a cable slider, slideably mounted upon at least one of the at least three cable arms, for holding the at least one cable in a position such that the at least one cable can more relative to the cable slider.

23. The system of claim 16, wherein one end portion of the coupled at least three cable arms is pivotally connected at a first position and the other end of the coupled at least three cable arms is pivotally connected at a fixed distance from the first position.

24. A system for managing at least one cable comprising:
an upper cable arm pivotably attached at its proximate end to a first structure at a first height;
a lower cable arm pivotably attached at its distal end to a second structure at a second height; and
an intermediate cable arm having a first and a second end, with the first end pivotably attached to the distal end of the upper cable arm and extending laterally therefrom, and the second end disposed above the lower cable aim and pivotably attached to the proximate end of the lower cable arm.

25. The system of claim 24, wherein each of the first and second structures comprises one of the group comprising a cabinet, an electronic device, a mounting flange, and a mounting hinge.

26. The system of claim 24, wherein the first and second structures are different portions of a cabinet.

27. The system of claim 24, wherein the distance between the first height and the second height is fixed.

28. The system of claim 24, further comprising a cable slider, slideably mounted upon at least one of the upper, lower, and intermediate cable arms, for holding the at least one cable in a position such that the at least one cable can move relative to the cable slider.

29. A system for managing at least one cable comprising:
an upper cable arm pivotably attached at its proximate end to a first structure at a first height;
a lower cable arm pivotably attached at its distal end to a second structure at a second height; and
an intermediate cable arm having a first and a second end, with the first end pivotably attached to the proximate end of the lower cable arm and extending laterally therefrom, and the second end disposed below the upper cable arm and pivotably attached to the distal end of the upper cable arm.

30. The system of claim 29, wherein each of the first and second structures comprises one of the group comprising a cabinet, an electronic device, a mounting flange, and a mounting hinge.

31. The system of claim 29, wherein the first and second structures are different portions of a cabinet.

32. The system of claim 29, wherein the distance between the first height and the second height is fixed.

33. The system of claim 29, further comprising a cable slider, slideably mounted upon at least one of the upper, lower, and intermediate cable arms, for holding the at least one cable in a position such that the at least one cable can move relative to the cable slider.

34. A system for managing at least one cable comprising:
- a first cable arm pivotably attached at its proximate end at a first position on a first structure;
- a second cable arm pivotably attached at its distal end to a second structure at a fixed distance from the first position;
- a third cable arm, having a first and a second end, with the first end pivotably attached to the distal end of the first cable arm and with the second end pivotably attached to the proximate end of the second cable arm.

35. The system of claim 34, wherein each of the first and second structures comprises one of the group comprising a cabinet, an electronic device, a mounting flange, and a mounting hinge.

36. The system of claim 34, wherein the first and second structures are different portions of a cabinet.

37. The system of claim 34, further comprising a cable slider, slideably mounted upon at least one of the first, second, and third cable arms, for holding the at least one cable in a position such that the at least one cable can move relative to the cable slider.

* * * * *

UNITED STATES PATENT AND TRADEMARK OFFICE
CERTIFICATE OF CORRECTION

PATENT NO. : 6,326,547 B1
DATED : December 4, 2001
INVENTOR(S) : Don M. Saxby et al.

It is certified that error appears in the above-identified patent and that said Letters Patent is hereby corrected as shown below:

<u>Title page,</u>
Under "U.S. PATENT DOCUMENTS" please replace "5,093,867 with -- 5,093,887. --

<u>Column 10,</u>
Line 34, please replace "aim" with -- arm --.

Signed and Sealed this

Fourteenth Day of May, 2002

Attest:

JAMES E. ROGAN
*Attesting Officer*    *Director of the United States Patent and Trademark Office*